United States Patent
Fuchs

(10) Patent No.: US 9,516,782 B2
(45) Date of Patent: Dec. 6, 2016

(54) ARRANGEMENT FOR COOLING ELECTRONIC COMPONENTS AND/OR ASSEMBLIES

(75) Inventor: Alfred Fuchs, Bergen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 269 days.

(21) Appl. No.: 14/110,269

(22) PCT Filed: Mar. 27, 2012

(86) PCT No.: PCT/EP2012/055423
§ 371 (c)(1),
(2), (4) Date: Oct. 7, 2013

(87) PCT Pub. No.: WO2012/136517
PCT Pub. Date: Oct. 11, 2012

(65) Prior Publication Data
US 2014/0036446 A1 Feb. 6, 2014

(30) Foreign Application Priority Data
Apr. 5, 2011 (DE) .................. 10 2011 006 779

(51) Int. Cl.
*H05K 7/20* (2006.01)
*G06F 1/20* (2006.01)
*F28F 3/00* (2006.01)

(52) U.S. Cl.
CPC ............. *H05K 7/20136* (2013.01); *F28F 3/00* (2013.01); *G06F 1/20* (2013.01); *H05K 7/20563* (2013.01)

(58) Field of Classification Search
CPC .............. H05K 7/20136; H05K 7/20563; H05K 7/20863; H05K 7/20154; H05K 7/20163; H05K 7/20909; H05K 7/202; H05K 7/20145; H05K 7/20172; F28F 3/00; G06F 1/20; G06F 2200/201; H01L 23/467; H01L 23/473; F04D 29/601

USPC .............. 361/695, 697, 679.47, 679.48, 694; 165/121
See application file for complete search history.

(56) References Cited

U.S. PATENT DOCUMENTS

| 4,027,206 A | 5/1977 | Lee |
| 5,663,868 A | 9/1997 | Stalley |

(Continued)

FOREIGN PATENT DOCUMENTS

| AT | 374034 | 3/1984 |
| CN | 200979680 | 11/2007 |

(Continued)

OTHER PUBLICATIONS

German language translation of Japanese Office Action for related Japanese Patent Application No. 2014-503067, issued Oct. 14, 2014, 3 pages.

(Continued)

*Primary Examiner* — Jerry Wu
*Assistant Examiner* — Stephen Sul
(74) *Attorney, Agent, or Firm* — Slayden Grubert Beard PLLC

(57) ABSTRACT

Components and/or assemblies are applied on a substrate. The substrate has a populating side and a heat sink side, to which a heat sink is fitted. The populating side is provided with a cover, which together with a heat sink on the heat sink side of the substrate forms a type of housing for the populated substrate. Between substrate and heat sink, a guide channel for a cooling medium (e.g. air, etc.) is provided and the substrate has an opening. A fan is fitted above the opening in such a way that a cooling flow of the cooling medium generated by the fan is conducted through the guide channel on the heat sink side of the substrate and over the populating side of the substrate and thus over the mounted components and/or assemblies. The heated cooling medium is then conducted away with the aid of the cover.

17 Claims, 1 Drawing Sheet

(56) References Cited

U.S. PATENT DOCUMENTS

| | | | | |
|---|---|---|---|---|
| 5,782,687 | A * | 7/1998 | Sniegocki | H04N 1/00519 |
| | | | | 174/16.1 |
| 6,262,891 | B1 * | 7/2001 | Wickelmaier | H05K 7/20909 |
| | | | | 165/80.4 |
| 7,248,471 | B2 * | 7/2007 | Wabiszczewicz | H05K 7/20154 |
| | | | | 165/121 |
| 2006/0087815 | A1 * | 4/2006 | Lanni | H05K 7/20136 |
| | | | | 361/695 |
| 2006/0232919 | A1 * | 10/2006 | Jeong | H05K 7/20972 |
| | | | | 361/679.22 |
| 2006/0291153 | A1 * | 12/2006 | Bae | G06F 1/1601 |
| | | | | 361/679.22 |
| 2009/0190309 | A1 | 7/2009 | Shan et al. | |
| 2009/0290306 | A1 | 11/2009 | Zhao et al. | |
| 2010/0172098 | A1 * | 7/2010 | Isoshima | H05K 7/20972 |
| | | | | 361/697 |
| 2011/0014862 | A1 | 1/2011 | Honold et al. | |
| 2012/0188727 | A1 * | 7/2012 | Lin | H05K 9/0026 |
| | | | | 361/728 |

FOREIGN PATENT DOCUMENTS

| | | | | |
|---|---|---|---|---|
| DE | 3121906 | | 4/1982 | |
| DE | 3121906 | A1 * | 4/1982 | G06F 1/20 |
| DE | 19653523 | | 7/1998 | |
| DE | 19806978 | | 8/1999 | |
| DE | 20220772 | | 4/2004 | |
| DE | 102011006779.5 | | 4/2011 | |
| JP | 62-80395 | | 5/1987 | |
| JP | 10117078 | | 5/1998 | |
| JP | 11-329922 | | 11/1999 | |
| JP | 2001284863 | | 10/2001 | |
| JP | 2011-503857 | | 1/2011 | |
| WO | PCT/EP2012/055423 | | 3/2012 | |

OTHER PUBLICATIONS

Chinese Office Action for related Chinese Patent Application 201280017184.1, issued on Jul. 1, 2015, 20 pages.

German language translation of Japanese Office Action for related Japanese Patent Application No. 2014-503067, issued Jun. 15, 2015, 10 pages.

Published by Clive Webster, "Nvidia GeForce GTX 470 1,280MB Review," http://www.bit-tech.net/hardware/graphics/2010/03/28/nvidia-geforce-gtx-470-1-1280mb-review/2, Mar. 28, 2010, 4 pages.

Wolfgang Andermahr, "Test: Nvidia GeForce GTX 470 (3/25), Effective. Better?," http://www.computerbase.de/artikel/grafik-karten/2010/test-nvidia-geforce-gtx-470/3/, Apr. 2010, 2 pages.

German Office Action for German Priority Patent Application No. 10 2011 006 779.5, issued on Jan. 30, 2012, 7 pages.

English language International Search Report for PCT/EP2012/055423, mailed Jul. 24, 2012, 2 pages.

English language Written Opinion for PCT/EP2012/055423, downloaded from WIPO Oct. 7, 2013, 5 pages.

* cited by examiner

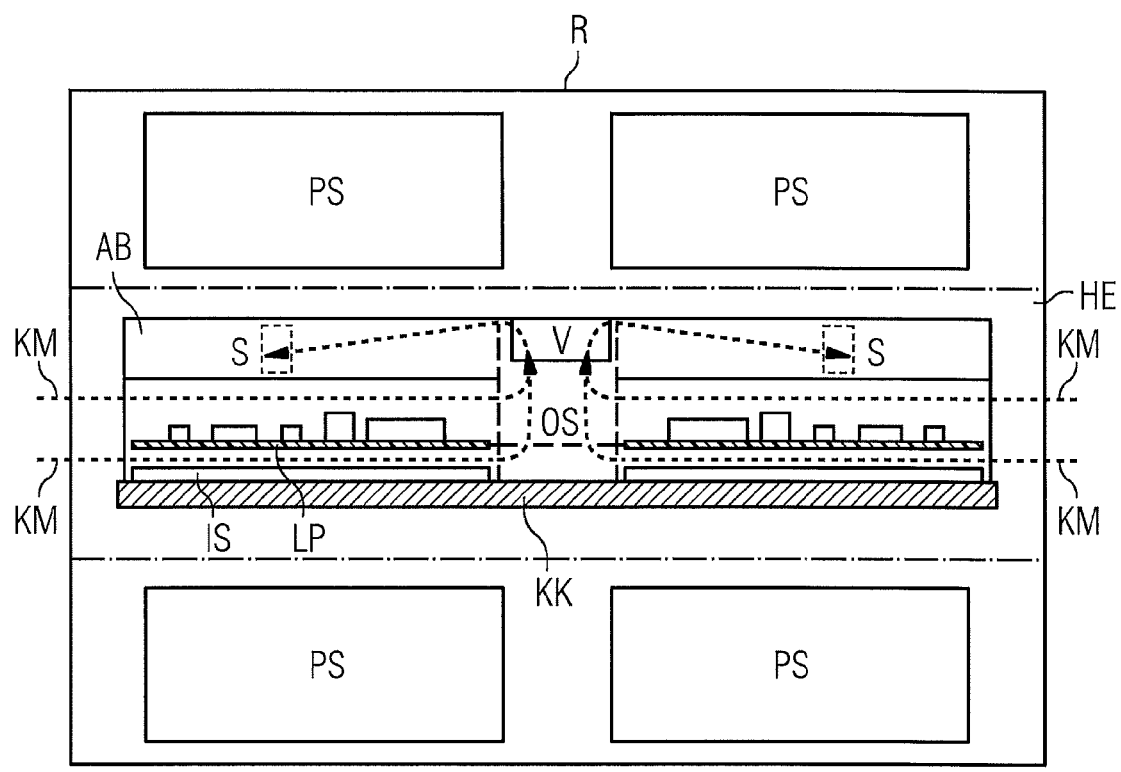

ARRANGEMENT FOR COOLING ELECTRONIC COMPONENTS AND/OR ASSEMBLIES

CROSS REFERENCE TO RELATED APPLICATIONS

This application is based on and hereby claims priority to International Application No. PCT/EP2012/055423 filed on Mar. 27, 2012 and German Application No. 10 2011 006 779.5 filed on Apr. 5, 2011, the contents of which are hereby incorporated by reference.

BACKGROUND

The invention relates to an arrangement for cooling electronic components and/or assemblies.

The development of electronics and primarily the development of electronic components, since the use of semiconductor technology, has been characterized in that both the components and the assemblies, including a plurality of components and devices in which the components/assemblies are installed, are becoming increasingly small.

Conventionally, electronic components and assemblies are applied by so-called Surface Mounted Technology (SMT) or by so-called Through Hole Technology (THT) onto a substrate which is also denoted as a printed circuit board. The substrate in this case is a carrier for electronic components and assemblies which are fastened mechanically to the substrate during the mounting process, for example by so-called reflow soldering. The substrate also has the necessary electrical connections—so-called printed conductors—for the circuits formed of the components and/or assemblies. One or more substrates populated with components and/or assemblies are then installed in a housing and together form therewith an electronic device which is able to be accommodated in a retaining device.

A widely-used retaining device for electronic devices is, for example, a so-called 19-inch rack. Said rack is a frame for electronic devices with a standard width of 19 inches, wherein the individual devices which are able to be mounted in said rack have a front plate width of 46.26 cm. A so-called vertical unit of said rack is fixed at 4.445 cm or 1.75 inches, wherein a rack generally has a plurality of vertical units. In computer centers, for example, racks having a height of 2 meters are often used, comprising, for example, 42 vertical units. The standards which refer to 19-inch racks are, for example, EIA 310-D, IEC 60297, DIN 41494 SC48D, etc. By standardizing the rack, any electronic devices may be installed in the rack provided they also correspond to the standards or dimensions set therein.

Due to the specifications set by the holding frame, electrical devices and substrates populated therewith are manufactured to suit this rack format. This results in a set height for the device and thus also for the design and population of the substrate. The components and assemblies are thus constructed horizontally, i.e. a substrate conventionally has only one side populated by components and/or assemblies—the so-called populating side.

During the operation of electronic components and/or assemblies, the limited efficiency thereof results in a power loss which is conventionally dissipated in the form of heat. This is highly significant, in particular in power electronic components (for example relays, thyristors, converters, etc.). Heat dissipation is, however, also becoming increasingly significant in semi-conductor electronics, such as for example integrated circuits (IC), transistors, diodes, field effect transistors, etc.—in particular in so-called deep-submicron semi-conductor components which have a relatively high standby current and thus corresponding heat generation. Heat may also be generated in printed conductors of the substrate, for example due to high currents and/or in capacitors, for example at high frequencies.

A high degree of electronic integration, for example due to the design of the device and/or restrictions for a fan, such as for example in so-called embedded systems, may lead to a temperature rise in components and/or assemblies which may already have an effect on the reliability of the device, even with a relatively low power loss of the components or assemblies. In order to prevent malfunctions by the heat generation or power loss of the components and/or assemblies, a corresponding cooling or dissipation of the heat has to be ensured. This is important, primarily in areas such as for example satellite technology, where a high degree of reliability of the devices is important.

To a certain extent, the heat loss of the components and/or assemblies may be dissipated from the substrate itself. The substrate, which is formed of an electrically insulating material (for example fiber-reinforced plastics material, etc.) and which, for example, has a high level of copper due to the electrical connections applied, thus functions as a so-called heat sink, for example. With a greater thermal power loss of the components (for example power electronic components, etc.) the substrate is, however, usually no longer adequate as a heat sink in order to discharge the heat and thus to ensure correct operation.

Thus, with greater thermal power losses, for example—according to the so-called bottom-side cooling principle—a separate heat sink is mounted on the side of the substrate remote from the mounted components and/or assemblies. This side of the substrate may thus also be denoted as the heat sink side. The heat losses are thus conducted through the substrate to the heat sink, assisted for example by so-called thermal vias, and discharged thereby for example by thermal radiation and/or convection to a surrounding cooling medium (for example air, etc.). The heat sink conventionally is formed of a metal having good thermal conductivity (for example aluminum, copper, etc.) and generally has a surface discharging the greatest possible amount of heat (for example waves, ribs, etc.). Occasionally, parts of the housing of the electronic device are also used as heat sinks. So-called passive and active heat sinks may be differentiated within the heat sinks.

A passive heat sink primarily acts by convection—i.e. the ambient air is heated and as a result is specifically lighter and rises, whereby an air current is produced and cooler air flows in. However, passive heat sinks—in particular with a horizontal construction of components and/or assemblies—such as for example for devices in 19-inch racks—have the drawback that the heat transport by natural convection is very low, in particular due to the relatively low height. This means that natural convection is not sufficient to prevent malfunctions due to heat losses or a negative impact on the reliability.

In order to achieve improved convection and thus cooling of the components or assemblies—in particular with a horizontal construction—so-called active heat sinks are used. An active heat sink—such as for example described in the publication DE 198 06 978 A1 or in the publication DE 196 53 523 A1—comprises one or more axial fans for producing a corresponding airflow in which a rotational axis of the impeller extends parallel or axially to the airflow. Due to the arrangement of the axial fans (for example to the side of the heat sink, wherein the rotational axis extends parallel to the housing) in a housing of low height, said fans generally have a small diameter and thus have to be operated at a relatively high rotational speed in order to ensure corresponding cooling. A problem when using axial fans is in the relatively high generation of noise. In addition to the noise produced, a drawback has also been shown to be a reduced service life due to the high rotational speed, as well as overheating due to dust, dirt etc. which may lead to breakdown of the fan and thus to malfunctions of the electronic device.

An electronic cooling chassis and/or cooling housing for an electronic device is disclosed in the publication U.S. Pat. No. 4,027,206. In this arrangement, a fan is also fitted in the housing. A cooling medium (for example air) is drawn in through housing openings by said fan and conducted over the electronic components of the electronic device in the housing interior. The fan in this case is oriented with the rotational axis of the impeller axially to the airflow and in this case the fan has a relatively small diameter due to the installation thereof. However, this has the drawback that a relatively high rotational speed for the operation of the fan is required for a corresponding airflow, whereby in addition to high noise generation the service life of the fan is also reduced. Moreover, the fan may overheat due to dust and/or dirt which may lead to breakdown of the fan and to malfunctions and/or damage to the electronic device.

So-called active heat sink arrangements are disclosed in the publication US 2009/0190309 A1 or the publication U.S. Pat. No. 5,663,868. The fans in these publications are also installed as axial fans—i.e. with a rotational axis of the impeller arranged parallel or axially to the airflow. Said fans have a low height due to the installation thereof in the housing and thus have to be operated at a relatively high rotational speed for corresponding cooling. Thus the arrangements disclosed in the publications US 2009/0190309 A1 and/or U.S. Pat. No. 5,663,868 also have the drawbacks of high noise generation and reduced service life of the fan.

In narrow spatial conditions, such as for example in laptops, for cooling graphics cards, processors, etc. in powerful personal computers (PC) or in very compact power electronic units, the so-called heatpipe principle is used. In this case a so-called heat pipe, which is generally produced from copper, transports the heat from the component, from the assembly, from the substrate, etc. to a heat sink. In high performance PC graphics cards—such as for example the "Nvidia GeForce GTX 470" graphics card—for example the heat pipe principle is supplemented by a radial fan arranged to the side of the heat sink and the heat pipe.

This arrangement for the Nvidia GeForce GTX 470 is shown, for example, on the homepage bit-tech.net under <bit-tech.net/hardware/graphics/2010/03/28_nvidia-geforce-qtx-470-1-1280-mb-review/2> or on the Internet page <computerbase.de/artikel/graphikkarten/2010/testnvidia-geforce-gtx-470/3/>. Although the heated air is forced out of the housing by the laterally arranged radial fan, by which air or a cooling medium is drawn in parallel or axially to the drive axis and deflected by 90° by a rotation of the radial impeller and blown out radially, an airflow is not produced for cooling the heat sink and/or the heat pipes. In other words, the air guidance and/or suction action of the radial fan is only partially utilized and barely used for cooling the components, resulting in the risk of the occurrence of so-called hot spots, i.e. hotter areas.

SUMMARY

One possible object, therefore, is to specify an arrangement by which reliable, efficient and relatively low-noise cooling of the electronic components and/or assemblies is achieved, where the overall height of an electronic device is low.

The inventor proposes an arrangement for cooling electronic components and/or assemblies, in particular of horizontally installed power electronics and/or in so-called embedded systems. In this case, the components and/or assemblies are applied to a substrate or a printed circuit board by mounting technologies such as for example so-called Surface Mounted Technology (SMT) and/or so-called Through Hole Technology (THT), wherein the substrate or the printed circuit board has a populating side and a heat sink side. A heat sink is located on the heat sink side of the substrate, said heat sink serving, in particular, for cooling components and/or assemblies having high power losses.

According to the proposal, the populating side of the substrate is provided with a cover which has, for example, two chambers formed by an intermediate plane, wherein a lower chamber covers the populating side of the substrate. Between the substrate and the heat sink, a guide channel for a cooling medium, such as for example air, is present and the substrate generally has at least one opening. A fan is fitted above said at least one opening, such that a cooling flow of the cooling medium generated by the fan is conducted both through the guide channel for the cooling medium below the substrate and in the lower chamber of the cover over the populating side of the substrate. The heated cooling medium is then conducted by the fan via the upper chamber of the cover which is further removed from the substrate, to the outer faces of the cover and/or the electronic device.

A main feature of the proposal is that in this arrangement, by the at least one fan, a cooling flow of a cooling medium, such as for example air, is produced in which the cool cooling medium is drawn in through the guide channel and into the lower chamber of the cover over the populating side of the substrate and then, due to a flow rate and/or by the fan, the heated cooling medium is discharged—for example from the housing of the electronic device—via the upper chamber of the cover. In this case, fans which operate slowly may be used, in particular, in order to ensure a corresponding flow of cooling medium. As a result, a substantially lower noise level is achieved than, for example, with relatively small axial fans arranged to the side of the heat sink. Moreover, due to the lower rotational speed of the fans, in the arrangement the service life thereof is increased and thus breakdowns or malfunctions of the components or assemblies due to excessive temperatures or excessive heating are considerably reduced.

A further advantage of the arrangement is that power losses or thermal losses may be discharged to the cooling medium from the electronic components or assemblies on both sides of the substrate—i.e. on the populating side and on the heat sink side. Additionally, in the arrangement the substrate may be used over a large surface area and on both sides for cooling as a heat sink and/or in addition to the heat sink. As a result, efficient cooling is achieved in a simple manner and reliable operation of the electronic device ensured. The arrangement thus permits in a simple manner an efficient thermal management or management of thermal dissipation in which even hot spots are avoided. By the greater efficiency during cooling, on the one hand, a greater power density and, on the other hand, savings in energy consumption for the cooling process are possible and thus costs for the electronic device are also reduced.

The arrangement also provides that the cooling flow of the cooling medium is conducted over the populating side of the substrate and/or the heated cooling medium is dissipated by the cover. Thus, the fan or, with a plurality of openings in the substrate, one fan for each opening, is advantageously fitted to the one side facing the populating side, or to a top side of the cover in order to conduct the cooling flow optimally and efficiently. This means that, by the fan(s), the cooling medium is drawn in from the direction of the substrate and through the at least one opening in the substrate. In this case, the effect that a heated cooling medium, in particular air, conventionally flows upward is also utilized, whereby energy and costs for the cooling process may be saved.

The cover may, for example, be additionally subdivided into two respective chambers by an intermediate plane in which openings for the fans are provided, wherein a lower chamber positioned closer to the populating side of the substrate assists the transport of the cool cooling medium over the populating side. An upper chamber positioned closer, for example, to a device housing may be used for discharging the heated cooling medium. To this end, the cover may ideally have openings on the upper outer edges and/or lateral surfaces, said openings being of slot-shaped or rectangular configuration, for example, and through which the heated cooling medium, for example, is discharged from the device. By the use or aid of the cover for conducting the cooling medium, for example the cool and heated cooling media are separated and the heated cooling medium discharged in a targeted manner.

The cover is advantageously produced from acrylic glass or polymethylmethacrylate which is a synthetic glass-like thermoplastic material. Acrylic glass of this type is sold under the PLEXIGLASS trademark. PLEXIGLASS has a thermal conductivity of ca. 0.19 W/mK. It also has the advantage that it is relatively weather-resistant and age-resistant, permits connections by bonding and welding and is relatively lightweight. Alternatively, however, an upper housing part of the electronic device may also be used as a cover and for fitting the fan(s). Thus, for example, aluminum which has good working properties, good electrical conductivity and thermal conductivity may be used as material.

It is advantageous if the cooling flow produced by the fan has a flow direction which is oriented radially—i.e. in a straight line from a point or along a radius—to the at least one opening of the substrate. Ideally, in particular, the cooling medium which is located in the guide channel below the substrate flows toward the opening in the substrate and is drawn in by the fan through the opening. This has the additional positive effect that the flow velocity is increased—by a so-called chimney effect—wherein this occurs at a point, for example, at which a temperature of the cooling medium is the greatest. The heated cooling medium is thus conducted more rapidly away from the components and assemblies and a potential excessive temperature is thus lower.

Thus it is particularly advantageous if a radial fan is used as a fan, as with a radial fan a greater pressure increase is achieved with the same quantity of cooling medium. In the radial fan, the cooling medium (for example air, etc.) is drawn in parallel or axially to the drive axis of the radial fan and then deflected by a rotation of the impeller by 90 degrees and blown out radially. By fitting the fan to the top surface of the cover, said cover is ideally able to draw the cooling medium over the substrate—in particular from the lower chamber of the cover—and out of the guide channel of the cooling medium via the opening in the substrate. The drawn-in cooling medium is then accordingly deflected—in particular into the upper chamber of the cover—and diverted.

A preferred embodiment of the invention that the at least one opening in the substrate is of circular configuration. Thus, in a simple manner, the at least one opening in the substrate is adapted to the shape of the fan, primarily to the radial fan, which is fitted via this opening. The fan, in particular a radial fan, is thus able to move the cooling medium in a very efficient manner centrally over the opening in the substrate in a vertical manner—i.e. perpendicular to the surface of the substrate—and a uniform and optimal cooling of the substrate is achieved, wherein for components or assemblies with particularly high heat generation a connection to the heat sink below the substrate may also be provided for increased cooling. The heat sink may then, for example depending on the design of the device, discharge the heat directly outside or via a lower housing part outside or even partially into the cooling flow in the guide channel. However, an insulating material which prevents heat dissipation of the heat sink to the cooling medium in the guide channel may also be attached to the upper face of the heat sink in the guide channel, so that the cooling flow at that point is only available for cooling the components and/or the assemblies or the substrate.

BRIEF DESCRIPTION OF THE DRAWINGS

These and other objects and advantages of the present invention will become more apparent and more readily appreciated from the following description of the preferred embodiments, taken in conjunction with the accompanying drawing of which:

FIG. 1 shows by way of example and schematically an embodiment for the proposed arrangement for cooling electronic components and/or assemblies.

DETAILED DESCRIPTION OF THE PREFERRED EMBODIMENT

Reference will now be made in detail to the preferred embodiments of the present invention, examples of which are illustrated in the accompanying drawing, wherein like reference numerals refer to like elements throughout.

FIG. 1 shows by way of example and schematically a rack R, such as for example a 19-inch rack in which an electronic device is installed. The rack in this case has a slide drawer HE for the installation of the electronic device, said slide drawer having a standard height of 4.445 cm or 1.75 inches. Above and below the electronic device are located by way of example power supply units PS for supplying power to the electronic device.

The electronic device shown by way of example and schematically comprises a substrate LP populated with electronic components and/or assemblies. The substrate LP has in this case a populating side to which the components and/or assemblies are attached and a heat sink side. On the heat sink side of the substrate LP is located a heat sink KK, which in particular serves for cooling components and/or assemblies with relatively high thermal losses. The heat sink KK may, for example, have grooves, etc. in order to enlarge a heat-dissipating surface. Additionally connections may be provided between the substrate LP and the heat sink KK for components and/or assemblies with particularly high heat generation in order to transfer the heat losses directly to the heat sink KK.

Between the heat sink side of the substrate LP and the heat sink KK a guide channel is provided, said guide channel serving to transport a cooling medium (for example air, etc.). An insulation material IS may also be fitted in the guide channel for electrical and/or thermal insulation, said insulation material preventing heat dissipation of the heat sink KK to the cooling medium KM in the guide channel, so that the cooling flow at that point is only available for cooling the components and/or assemblies or the substrate LP.

A cover AB is attached over the populating side of the substrate LP, said cover being produced from PLEXIGLASS, for example, and together with the heat sink forming a type of housing for the substrate LP. The cover in this case has, for example, two chambers which are formed by an intermediate plane and are used for efficient transport of the cooling medium. The lower chamber covers the populating side of the substrate LP and the upper chamber which is further removed from the substrate LP may be used for discharging the cooling medium KM. An opening is provided in the intermediate plane of the cover LP into which a fan V fitted to the upper face of the cover AB, in particular a radial fan V, protrudes. For the circulation of the cooling medium, the two chambers of the cover AB may be designed to be open in the region of the opening of the intermediate plane.

The substrate LP of the electronic device has at least one opening OS which may be configured, for example, to be circular. The opening in the intermediate plane of the cover AB as well as the fan V are located above this opening OS. A cooling flow of the cooling medium KM is produced by the fan V. Due to this cooling flow, cool cooling medium KM is drawn in from the outer faces of the electronic device. The cooling medium KM is then transported below the substrate LP through the guide channel and above the substrate LP in the lower chamber of the cover to the opening OS. The cooling medium KM is heated during transport by the thermal losses of the components and/or assemblies on the substrate LP and the components and/or assemblies are cooled respectively by the cooling medium KM.

In the region of the opening OS in the substrate LP, the heated cooling medium KM is then drawn up in a vertical manner—in the direction of the upper chamber of the cover AB—by the fan V. The flow direction—vertically or radially to the opening OS in the substrate LP—has the additional effect that a flow velocity of the heated cooling medium KM is increased. By the fan V, the heated cooling medium KM is then deflected into the upper chamber of the cover AB and, for example, conveyed to a rear end and/or the outer faces of the cover AB. Openings S are provided at an upper edge of the outer faces and/or in the rear outer surface of the cover AB of the electronic device, said openings being able to be of slot-shaped or rectangular configuration. The heated cooling medium KM, in particular air, is then blown out through these openings S.

By the combination of the heat sink KK and the cooling flow produced by the fan V an efficient discharge of the thermal losses is achieved and so-called hot spots i.e. components and/or assemblies with high heat generation—avoided on the substrate LP. Due to the cooling flow of the cooling medium KM on both sides, the substrate LP itself may also be used for cooling over a large surface area and on both sides. By positioning the fan V over the opening OS in the substrate LP, it is also possible to use fans which operate slowly and thus are low-noise (for example radial fans), which have a substantially longer service life and thus additionally ensure a greater reliability of the electronic device.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. An arrangement, comprising:
    a substrate having at least one opening,
    a heat sink side below the substrate, and
    a populating side above the substrate to accommodate electronic components and/or assemblies to be cooled;
    a cover provided on the populating side, having
        a lower chamber covering the populating side of the substrate, and
        an upper chamber separated from the lower chamber by an intermediate plane;
    a heat sink to dissipate heat from the substrate, the heat sink being provided on the heat sink side of the substrate such that the substrate is provided between the heat sink and the electronic components and/or assemblies;
    insulation material positioned above the heat sink and below the substrate;
    a guide channel for a cooling medium provided between the substrate and the heat sink insulation material above the heat sink; and
    a fan fitted above the substrate and the at least one opening, such that
        a first cooling flow of the cooling medium generated by the fan is conducted through the guide channel below between the substrate and the insulation material above the heat sink, and then through the at least one opening in the substrate, wherein the insulation material reduces heat transfer between the heat sink and the first cooling flow,
        a second cooling flow of the cooling medium generated by the fan is conducted in the lower chamber of the cover over the populating side of the substrate,
        the cooling medium absorbs heat to become a heated cooling medium, and
        the heated cooling medium is deflected by the fan into the upper chamber of the cover and conducted toward outer faces of the cover.

2. The arrangement as claimed in claim 1, further comprising the electronic components and/or assemblies, wherein the electronic components and/or assemblies are mechanically fastened to the substrate.

3. The arrangement as claimed in claim 1, wherein the cooling flow produced by the fan moves radially toward the at least one opening of the substrate.

4. The arrangement as claimed in claim 1, wherein the cooling flow produced by the fan moves radially below the substrate, axially through the at least one opening and radially above the substrate.

5. The arrangement as claimed in claim 1, wherein the fan is attached to a side of the cover facing the populating side of the substrate.

6. The arrangement as claimed in claim 1, wherein
    the intermediate plane of the cover has an opening aligned with the opening of the substrate,
    the fan is fitted to a side of the cover facing the populating side of the substrate, and
    the fan protrudes into the opening of the intermediate plane.

7. The arrangement as claimed in claim 1, wherein the fan is a radial fan.

8. The arrangement as claimed in claim 1, wherein the at least one opening in the substrate is of circular configuration.

9. The arrangement as claimed in claim 1, wherein the cover has openings on outer edges and/or lateral surfaces.

10. The arrangement as claimed in claim 1, wherein the cover has slot-shaped openings on outer edges and/or lateral surfaces.

11. The arrangement as claimed in claim 1, wherein the cover is produced from Plexiglass.

12. The arrangement as claimed in claim 1, further comprising:
a first power supply provided on the populating side of the substrate such that the cover is positioned between the substrate and the first power supply; and
a second power supply provided on the heat sink side of the substrate such that the heat sink is positioned between the substrate and the second power supply.

13. The arrangement as claimed in claim 1, wherein
the first cooling flow generated by the fan moves radially below the substrate and then axially through the at least one opening,
the second cooling flow generated by the fan moves radially over the populating side of the substrate, and
the upper chamber of the cover guides the heated cooling medium radially, toward outer faces of the cover.

14. An arrangement, comprising:
a substrate having an opening, a heat sink side below the substrate, and a populating side above the substrate;
electronic components and/or assemblies mounted on the populating side of the substrate, on both sides of the opening in the substrate;
a cover provided on the populating side of the substrate, having
a lower chamber covering the populating side of the substrate, and
an upper chamber separated from the lower chamber by an intermediate plane;
a heat sink to dissipate heat from the electronic components and/or assemblies, the heat sink being provided on the heat sink side of the substrate;
insulation material positioned above the heat sink and below the substrate;
an upper guide channel for a cooling medium, provided between the populating side of the substrate and the intermediate plane of the cover;
a lower guide channel for the cooling medium, provided between the heat sink and the heat sink side of the substrate and the insulation material above the heat sink; and
a fan fitted above the substrate and aligned with the opening in the substrate such that a center axis of the fan is aligned to extend through the opening, such that
an upper cooling flow of the cooling medium generated by the fan is conducted through the upper guide channel and over the populating side of the substrate,
a lower cooling flow of the cooling medium generated by the fan is conducted through the lower guide channel between the heat sink and the heat sink side of the substrate and the insulation material above the heat sink, wherein the insulation material reduces heat transfer between the heat sink and the lower cooling flow,
with the upper cooling flow and the lower cooling flow, the cooling medium absorbs heat to become a heated cooling medium, and
the heated cooling medium is drawn by the fan from the lower chamber of the cover and into the upper chamber of the cover from which the heated cooling medium is conducted out of the cover.

15. The arrangement as claimed in claim 14, wherein connections are provided between the substrate and the heat sink to transfer heat from the electronic components and/or assemblies to the heat sink.

16. The arrangement as claimed in claim 14, further comprising:
a first power supply provided on the populating side of the substrate such that the cover is positioned between the substrate and the first power supply; and
a second power supply provided on the heat sink side of the substrate such that the heat sink is positioned between the substrate and the second power supply.

17. The arrangement as claimed in claim 14, wherein
the lower cooling flow generated by the fan moves radially below the substrate and then axially through the opening,
the upper cooling flow generated by the fan moves radially over the populating side of the substrate, and
the upper chamber of the cover guides the heated cooling medium radially, toward radial outer faces of the cover.

* * * * *